United States Patent [19]
Cheng et al.

[11] Patent Number: 5,536,676
[45] Date of Patent: Jul. 16, 1996

[54] LOW TEMPERATURE FORMATION OF SILICIDED SHALLOW JUNCTIONS BY ION IMPLANTATION INTO THIN SILICON FILMS

[75] Inventors: Huang-Chung Cheng, Hsinchu; Cheng-Tung Lin, Taichung; Chi-Hung Chao, Taipei, all of Taiwan

[73] Assignee: National Science Council, Taipei, Taiwan

[21] Appl. No.: 415,666

[22] Filed: Apr. 3, 1995

[51] Int. Cl.[6] .................... H01L 21/283; H01L 21/225
[52] U.S. Cl. .................. 437/162; 437/200; 437/201; 437/247
[58] Field of Search ..................... 437/200, 162, 437/193, 201, 247; 248/DIG. 19, DIG. 147

[56] References Cited

U.S. PATENT DOCUMENTS

| | | | |
|---|---|---|---|
| 4,764,480 | 8/1988 | Vora | 437/54 |
| 4,966,868 | 10/1990 | Murali et al. | 437/193 |
| 5,254,495 | 10/1993 | Lur et al. | 437/70 |
| 5,302,539 | 4/1994 | Haken et al. | 437/41 |
| 5,302,552 | 4/1994 | Duchateau et al. | 437/200 |
| 5,403,772 | 4/1995 | Zhang et al. | 437/101 |
| 5,409,853 | 4/1995 | Yu | 437/41 |

OTHER PUBLICATIONS

Wolf et al., Silicon Processing, vol. 1, 1986, Lattice Press, pp. 175–180, 303–305, 318–327, 514–518.

Murarka, S., "Refractory Silicides for integrated circuits", J. Vac. Sci. Technol. 17(4), Jul./Aug. 1980, pp. 775–792.

Wolf, Silicon Processing, vol. 2, 1990, Lattice Press, pp. 144–147.

Hove et al., "Comparison Between $CoSi_2$ and $TiSi_2$ as Dopant For Shallow Silicided Junction Formation", Applied Surface Science, vol. 38, 1989, pp. 430–440.

Primary Examiner—T. N. Quach
Attorney, Agent, or Firm—Fish & Richardson

[57] ABSTRACT

A method for forming silicided shallow junctions, wherein impurities are implanted into a silicon layer formed over a silicon substrate. A metal layer selected from one of platinum (Pt), palladium (Pd), nickel (Ni) and cobalt (Co) is deposited over the silicon layer. At least one low temperature annealing process is carried out to form a silicide layer as well as the shallow junctions. Pre-anneal of the silicon layer and post-anneal of the silicide between 450° and 600° C. are also employed.

19 Claims, 4 Drawing Sheets

LOW TEMPERATURE FORMATION OF SILICIDED SHALLOW JUNCTIONS BY ION IMPLANTATION INTO THIN SILICON FILMS

BACKGROUND OF THE INVENTION

1. Field of the Invention

This invention relates to the processing of semiconductor devices, and more specifically to a low-temperature formation of silicided shallow junctions by ion implantation into thin silicon films.

2. Prior Art

There is a trend towards fabricating chips with both higher device density and more complex chip functions in the semiconductor industry. Therefore, the size of a semiconductor device should be reduced to desirable dimensions. As the size of a semiconductor device decreases, the depth of junctions between drain/source regions and the substrate region must be reduced too, otherwise, the device will fail in operation due to a large leakage or the punchthrough effect from its unsuitable junction depth.

Typically, a heavily doped P-type diffusion region is formed by implanting boron ions into an N-type semiconductor substrate, thus forming a P+-N junction. Since the boron ions are small and light, the implanted ions diffuse easily inside the silicon substrate. Therefore, the conventional P+-N junctions formed by boron ions are difficult to control in small areas.

In order to reduce the dimensions of the semiconductor devices, several methods are provided to overcome the above mentioned problems. For example, the heavily doped P-type region can be formed by implanting ions through a metal film or a silicide film over the substrate. The metal or silicide film keeps the ions therein, and the ions are driven into the substrate only after an annealing process, thus diminishing the diffusion effect of the ions and reducing the junction depth. Refer to FIG. 1A through 1C, which illustrate the process steps for forming a shallow P+-N junction by implanting ions through a titanium layer.

Referring to FIG. 1A, a field oxide layer 12 is formed over an N-type silicon substrate 10 to define active regions. A titanium layer 14 is deposited upon silicon substrate 10 and contacts the surface of silicon substrate 10 in the active regions.

Next referring to FIG. 1B, an ion implantation step is carried out by implanting $BF_2^+$ ions into titanium layer 14.

The structure of FIG. 1B is further processed by an annealing step. Referring to FIG. 1C, a heavily doped P-type diffusion region 20 in silicon substrate 10 is formed after the annealing step. P-type diffusion region 20 is formed through the impurity drive-in effect during the recrystallization of titanium layer 14.

However, the efficiency of the impurity drive-in effect for the titanium layer is not uniform. That is, the amount of impurities driven into the silicon substrate is difficult to predict and the junction depth is beyond control. Furthermore, the annealing temperature should be higher than 700° C. if a titanium layer is used, or the junction leakage current will be too high to be acceptable. Since the high annealing temperature facilitates the diffusion of impurities in the silicon substrate, the junction depth can not be well controlled. Therefore, the conventional process for forming P+-N junctions by implanting ions through a metal film or a silicide film is not satisfactory for the fabrication of small geometry semiconductor devices.

SUMMARY OF THE INVENTION

Accordingly, it is an object of the present invention to provide a method for forming shallow $P^+$-N junctions by implanting impurities into a silicon layer, and through the high impurity drive-in ability of the silicon layer, the formation of the shallow junctions can be controlled easily.

Another object of the invention is to provide a method for forming shallow $P^+$-N junctions through a low temperature process, thus suppressing the diffusion of impurities in the substrate and keeping the junction depth in a desirable range.

These and other objects and advantages are achieved through a process in which impurities are implanted into a silicon layer formed over a silicon substrate. The silicon layer reacts with a metal layer deposited thereon to form a metal silicide layer during a low temperature annealing process, thus driving the impurities into the silicon substrate and forming a shallow junction. The temperature of the annealing process can be as low as 300° to 500° C. and the junction depth is well-controlled.

DETAILED DESCRIPTION OF THE INVENTION

FIG. 2A through FIG. 2E are cross-sectional views of the process steps of a preferred embodiment of the invention.

Figure 1A:
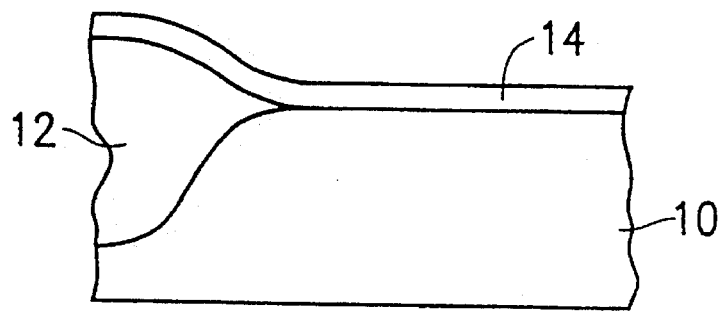
FIGS. 1A through 1C illustrate, in cross section, the process steps according to the prior art.
Figure 1B:
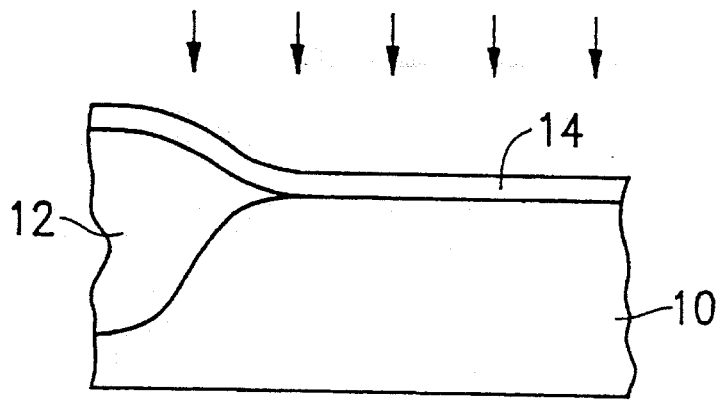
Figure 1C:
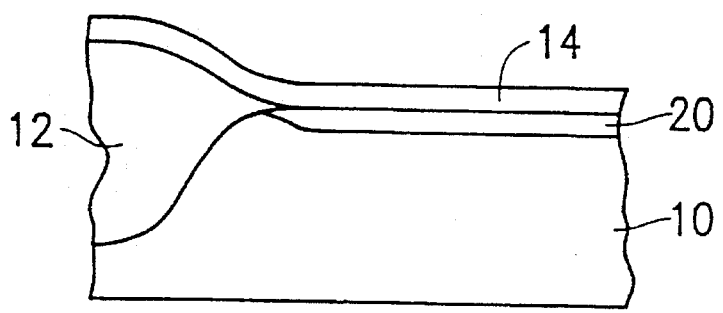
Figure 2A:
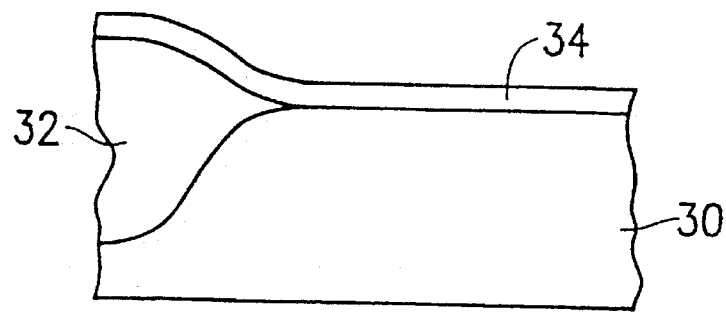
FIGS. 2A through 2E illustrate, in cross section, the process steps in accordance with a preferred embodiment of the present invention.

Referring to FIG. 2A, an N-type silicon substrate 30 (or, an N-type well formed in a P-type substrate not shown in the drawing) is provided. A field oxide layer 32 is formed by, for example, local oxidation on silicon (LOCOS) to define an active region. The exposed substrate surface, i.e., the surface of the active region is processed by a predip step for removing a native oxide layer thereon. The predip step can be carried out by wet etching in a hydrofluoric acid (HF) solution. A silicon layer 34 is deposited by, for example, the chemical vapor deposition (CVD) method, to overlie the active region. Silicon layer 34, such as a polysilicon layer or an amorphous silicon layer, is deposited to a thickness of about 1000Å. Further, silicon layer 34 can be defined and patterned by a lithography step to cover contact regions only, while there is an alternative method that employs selective deposition to deposit silicon on the contact regions only.

Figure 2B:
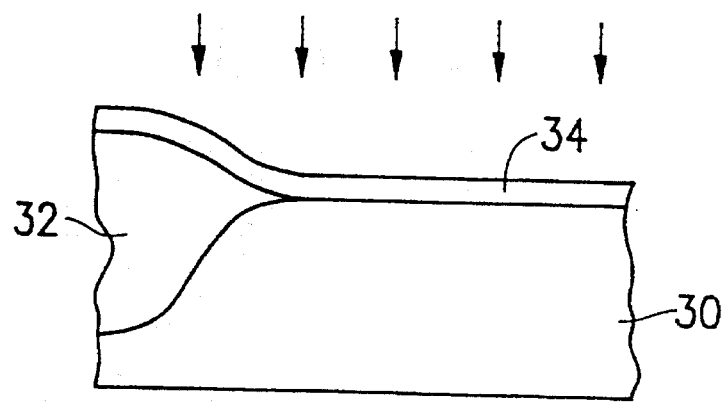

Next referring to FIG. 2B, an ion implantation step is processed by implanting $BF_2^+$ ions into silicon layer 34. The ion implantation step is carried out at an implanting energy of about 125 KeV with a dosage of between 1E15 and 1E16/cm².

Figure 2C:
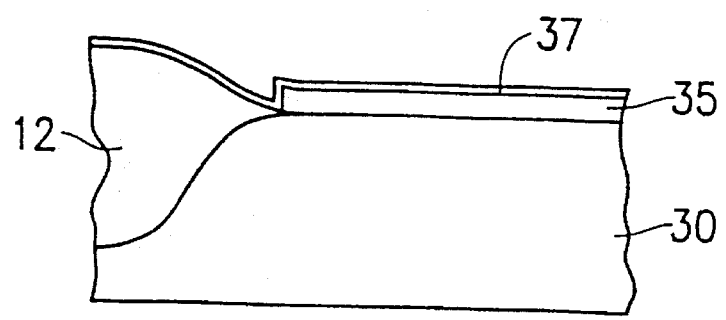

The structure of FIG. 2B is subjected to a photolithography step and an etching step for removing the silicon above field oxide layer 32, thus leaving silicon layer 35 over the active region. Then a pre-annealing process is carried out in a conventional furnace at a temperature within the range of 450°–600° C. for about 60 minutes. The pre-annealing process is for the activation of the impurities in silicon layer 35. Referring to FIG. 2C, a metal layer 37 is deposited over the structure. Metal layer 37 can be platinum (Pt), palladium (Pd), nickel (Ni) or cobalt (Co). The thickness of metal layer 37 depends on what material it consists of. The preferred thicknesses and the corresponding metal silicides of various metal layer are listed in table 1.

TABLE 1

| Metal | Thickness | Metal Silicide |
| --- | --- | --- |
| Platinum (Pt) | 1000Å | PtSi |
| Palladium (Pd) | 2000Å | $Pd_2Si$ |
| Nickel (Ni) | 700Å | NiSi |
| Cobalt (Co) | 300Å (or 450Å) | $CoSi_2$ |

Figure 2D:
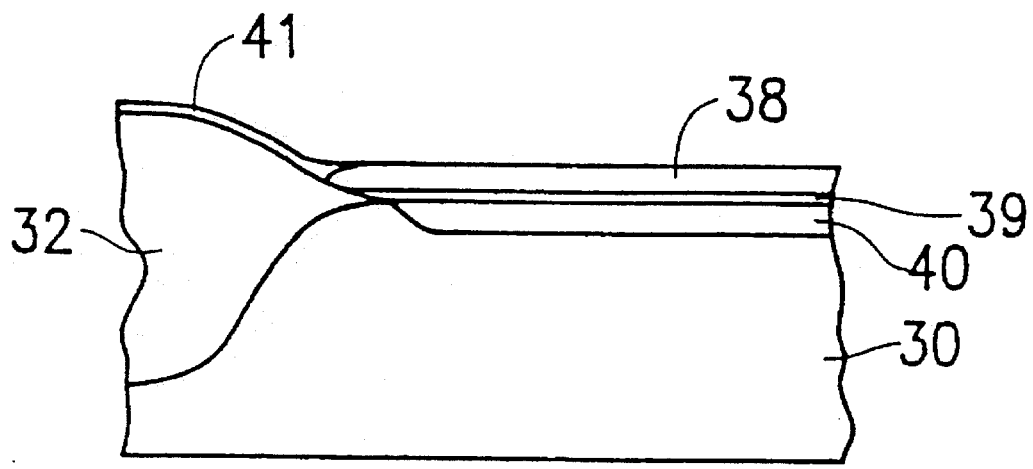

The structure of FIG. 2C is subjected to an annealing process at a temperature of about 400° C. for about 60 minutes (or if metal layer 37 is a palladium layer, the annealing temperature is about 300° C.). Referring to FIG. 2D, a silicide layer 38 formed by the reaction of silicon layer 35 and metal layer 37 overlies the active region, and a heavily doped P-type diffusion region 40 is formed in silicon substrate 30. P-type diffusion region 40 is formed by the impurity drive-in effect of silicon layer 35 during its reaction with metal layer 37. There is no silicide above field oxide layer 32 since the absence of the silicon layer, and a portion of metal layer 41 is left thereon. Since the ratio of the thickness of silicon layer 35 and metal layer 37 is not precisely equal to that required for forming a silicide layer, an excess portion of the silicon layer may exist above the active region. For example, as shown in FIG. 2D, a silicon layer 39 is left after the formation of silicide layer 38.

Figure 2E:
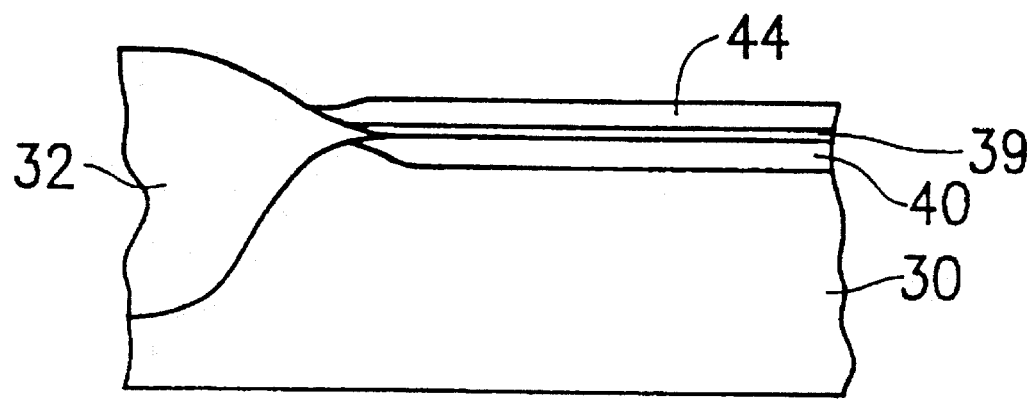

Further referring to FIG. 2E, metal layer 41 and other unreacted metal above the active, if any, have been removed by a selective etching process. Then a post-annealing process is carried out by heating the structure under the conditions same as that of the pre-annealing process. The post-annealing process, heating the structure at a temperature between 450° and 600° C. for about 1 hour, is to form a more stable silicide layer 44, as shown in FIG. 2E. Silicide layer 44, such as PtSi, $PD_2Si$, NiSi or $CoSi_2$ layer, also has a lower resistance due to the post-annealing process.

Figure 3:
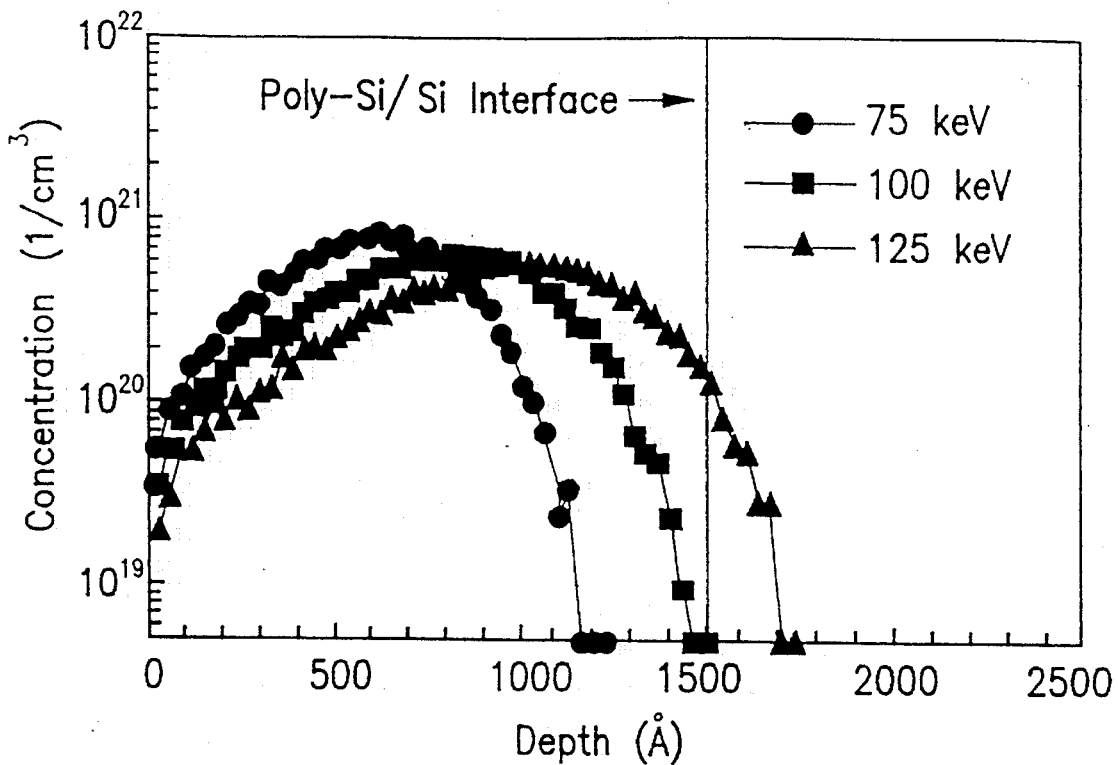
FIG. 3 illustrates the relationships between the impurity concentration and the distance from the substrate surface for various implanting energies according to the present invention.
Figure 4:
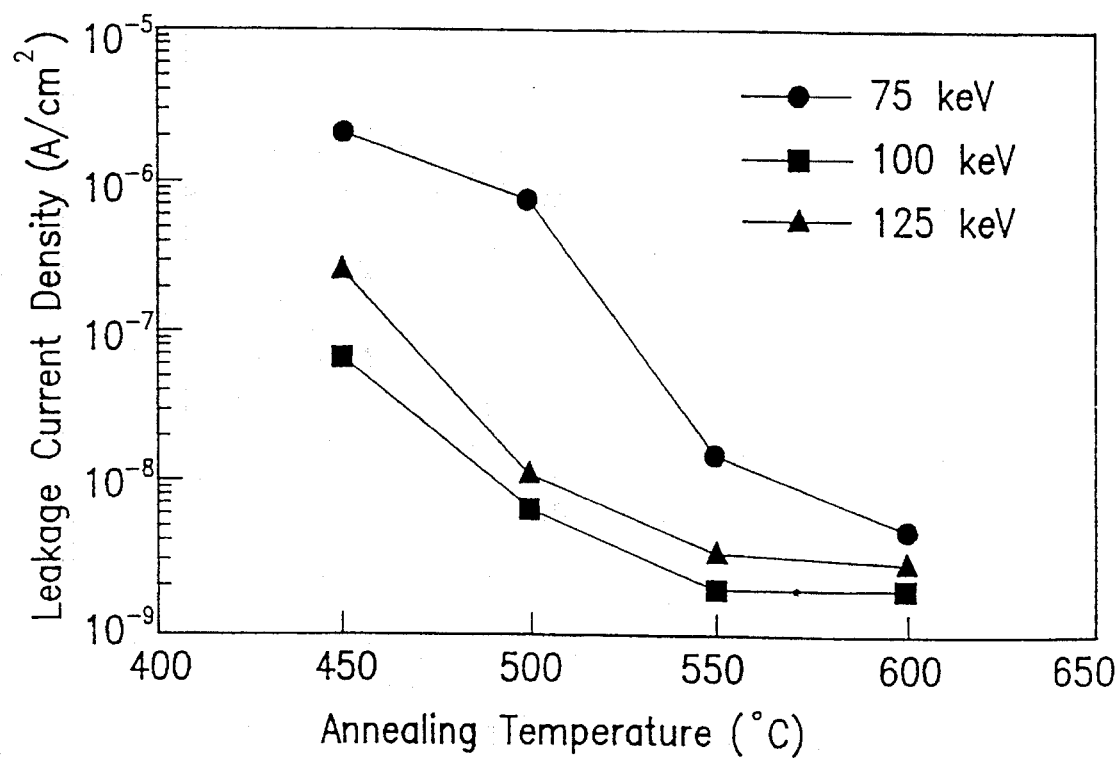
FIG. 4 illustrates the relationships between the junction leakage current and the annealing temperature for various implanting energies according to the present invention.

P-type diffusion region 40 has a shallow junction depth in silicon substrate 30 because of the low temperature annealing processes. FIG. 3 illustrates the relationships between the impurity concentration and the distance from the interface of silicon layer 35 and silicon substrate 30 for various implanting energies. For an implanting dosage of about $5E15/cm^2$, a preferred implanting energy is about 100 KeV. If the implanting energy is too high, the surface of silicon substrate 30 will be damaged by impurities that are implanted through silicon layer 34, as shown in FIG. 2B. If the implanting energy is too low, most of the impurities are concentrated far away from the interface of silicon layer 35 and silicon substrate 30, thus decreasing the impurity drive-in effect of silicon layer 35. FIG. 4 illustrates the relationships between the leakage current density and the annealing temperature for various implanting energies. For a low implanting energy of about 15 KeV, the annealing temperature should be as high as 600° C. in order to drive the shallow distributed impurities into silicon substrate 30 to a desirable junction depth. However, for an implanting energy of about 125 KeV, the leakage current density is still high since silicon substrate 30 has its surface damaged by the implanting impurities. As shown in the figure, a preferred junction depth of about 0.05 μm with a leakage current density of 7 $nA/cm^2$ is fabricated by an implanting energy of about 100 KeV and an annealing temperature of about 500° C. As the annealing temperature increases to 550° C., the leakage current density will further decrease to 2 $nA/cm^2$, while the junction depth increases.

The afore-mentioned method can also be applied to form an N+-P junction in a P-type silicon substrate by implanting N-type impurities into a silicon layer.

What is claimed is:

1. A method for forming shallow junctions on a silicon substrate of a first conductivity type comprising the steps of:

forming a silicon layer over said silicon substrate;

implanting impurities of a second conductivity type into said silicon layer;

pre-annealing said silicon layer at a temperature in a range between about 450° and 600° C.;

forming a metal layer over said silicon layer;

annealing said silicon layer and said metal layer to form a metal silicide layer, thus driving said impurities into said silicon substrate and forming shallow junctions therein;

removing unreacted metal; and post-annealing said metal silicide layer at a temperature in a range between about 450° and 600° C. for forming a stable silicide layer.

2. The method of claim 1 further comprising a predip step prior to the formation of said silicon layer for removing a native oxide layer over said silicon substrate.

3. The method of claim 1, wherein said silicon substrate of first conductivity type is an N-type silicon substrate, and said impurities of second conductivity type are P-type impurities.

4. The method of claim 3, wherein said silicon layer is a polysilicon layer having a thickness of about 1500Å.

5. The method of claim 3, wherein said silicon layer is an amorphous silicon layer.

6. The method of claim 3, wherein said implanting step is carried out by implanting $BF_2^+$ ions at an implanting energy between 75 and 125 KeV and a dose between 1E15 and $1E16/cm^2$.

7. The method of claim 6, wherein said metal layer is a platinum (Pt) layer having a thickness of about 1000Å.

8. The method of claim 7, wherein said metal silicide layer is a platinum silicide (PtSi) layer.

9. The method of claim 6, wherein said metal layer is a palladium (Pd) layer having a thickness of about 2000Å.

10. The method of claim 9, wherein said metal silicide layer is a palladium silicide ($Pd_2Si$) layer.

11. The method of claim 10 wherein said annealing step is carried out at a temperature of about 300° C.

12. The method of claim 6, wherein said metal layer is a nickel (Ni) layer having a thickness of about 700Å.

13. The method of claim 12, wherein said metal silicide layer is a nickel silicide (NiSi) layer.

14. The method of claim 6, wherein said metal layer is a cobalt (Co) layer having a thickness of about 300Å.

15. The method of claim 14, wherein said metal silicide layer is a cobalt silicide ($CoSi_2$) layer.

16. The method of claim 8, 13 or 15 wherein said annealing step is carried out at a temperature of about 400° C. for about 60 minutes.

17. The method of claim 1, wherein said pre-annealing step is carried out for about 60 minutes.

18. The method of claim 1, wherein said post-annealing step is carried out for about 60 minutes.

19. The method of claim 1, wherein said silicon substrate of first conductivity type is a P-type silicon substrate, and said impurities of second conductivity type are N-type impurities.

* * * * *